United States Patent [19]

Adolph et al.

[11] 4,316,138

[45] Feb. 16, 1982

[54] ELECTRIC SWITCHING SECTION

[75] Inventors: Erich Adolph, Frankfurt am Main; Ünal Bayrak, Bischofsheim; Walter Stecker, Heusenstamm, all of Fed. Rep. of Germany

[73] Assignee: Siemens Aktiengesellschaft, Munich, Fed. Rep. of Germany

[21] Appl. No.: 184,472

[22] Filed: Sep. 5, 1980

[30] Foreign Application Priority Data

Sep. 26, 1979 [DE] Fed. Rep. of Germany ... 7927354[U]

[51] Int. Cl.³ .............................................. H03H 1/00
[52] U.S. Cl. .................................................... 323/364
[58] Field of Search ............... 323/233, 355, 359, 364

[56] References Cited

U.S. PATENT DOCUMENTS

| | | | |
|---|---|---|---|
| 3,900,791 | 8/1975 | Kleen et al. | 323/359 |
| 3,942,106 | 3/1976 | Hermstein et al. | 323/364 |
| 3,943,433 | 3/1976 | Hermstein et al. | 323/358 |
| 3,974,440 | 8/1976 | Schiemann et al. | 323/364 |

FOREIGN PATENT DOCUMENTS

1141962 2/1967 United Kingdom .

*Primary Examiner*—William M. Shoop
*Attorney, Agent, or Firm*—Kenyon & Kenyon

[57] ABSTRACT

An electric switching section within a metal encapsulation containing an insulating gas, for instance $SF_6$ is disclosed. The metal encapsulation encloses at least one transformer and a vacuum switching tube for each phase. The switching tube is enclosed in part by the transformer device and has a stationary terminal. The transformer includes a cup-shaped electrode which constitutes the inner electrode of a capacitive voltage transformer. The bottom of the cup-shaped electrode is detachably connected to the stationary terminal of the switching tube and to an extension of a cable termination. The bottom of the electrode is further detachably fastened to a feedthrough plate, through which the extension passes. This arrangement in cooperation with a conventional outer electrode permits the voltage present at the vacuum switching tube to be measured in a simple manner.

2 Claims, 1 Drawing Figure

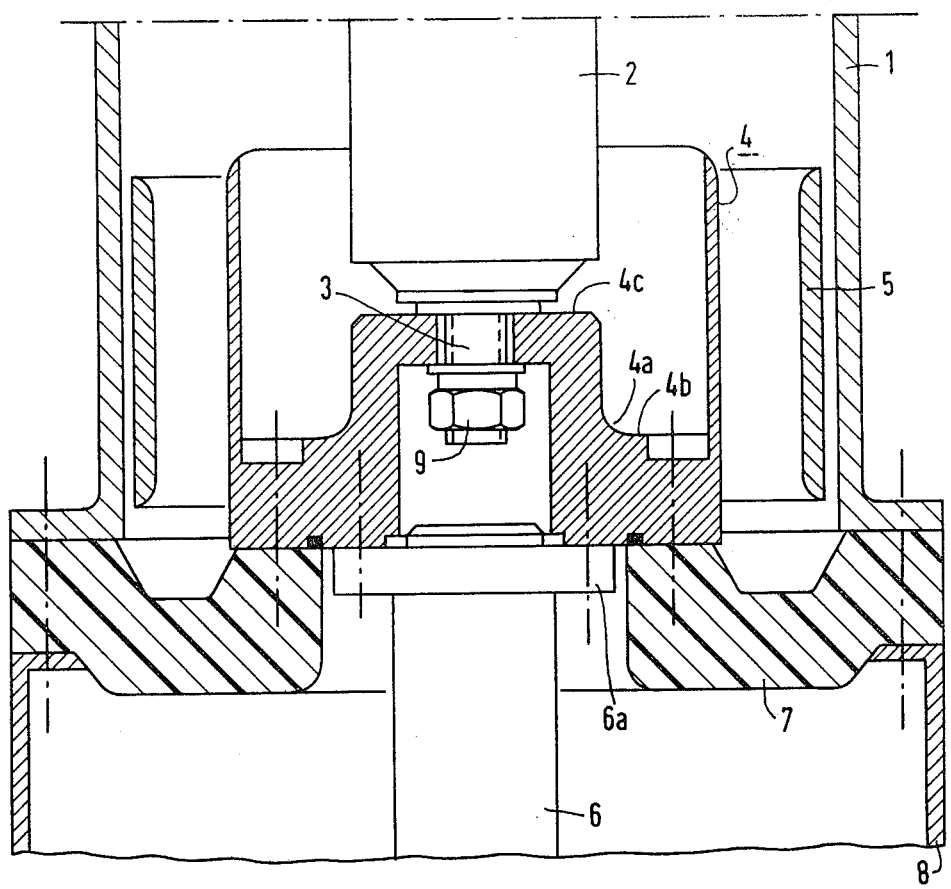

ELECTRIC SWITCHING SECTION

BACKGROUND OF THE INVENTION

The present invention relates to an electric switching section which is enclosed in a metal encapsulation filled with an insulating gas.

A prior art transformer which constitutes the secondary winding of a current transformer is disclosed in British Pat. No. 11 41 962.

OBJECT AND SUMMARY OF THE INVENTION

It is an object of the invention to provide, in an electric switching section of the aforementioned type, means for measuring the voltage present at the vacuum switching tube in a simple manner.

According to the invention, the invention has the advantage that a cup-shaped electrode not only provides for measuring the voltage present at the stationary terminal of the vacuum switching tube, but at the same time also serves as an intermediate member for connecting the vacuum switching tube to a cable connection, and the vacuum switching tube to a feedthrough plate.

These and other aspects of the present invention will be more apparent from the following description of the preferred embodiment taken in conjunction with the accompanying drawings and appended claims.

BRIEF DESCRIPTION OF THE DRAWINGS

The present invention is illustrated by way of example and not limitation in the sole FIGURE of the accompanying drawing which is a schematic side view, in cross-section of the switching section according to the invention.

DESCRIPTION OF THE PREFERRED EMBODIMENT

Referring to the drawing, a metal encapsulation 1 of an electric switching section containing an insulating gas, for instance, $SF_6$, for each phase contains at least one transformer device and a vacuum switching tube 2 enclosed by the transformer device.

The vacuum switching tube 2 has a stationary terminal 3 which is connected to a cable terminal, not shown. The transformer device comprises a cup-shaped electrode 4 which constitutes the inner electrode of a capacitive voltage transformer.

An outer electrode 5 of the voltage transformer is fastened, electrically insulated, to the metal encapsulation 1 and constitutes a voltage tap. The electrode 5 is conventional as is its fastening to the metal encapsulation.

The bottom 4a of the cup-shaped electrode 4 is detachably connected to the stationary terminal 3 of the vacuum switching tube 2 and an extension 6 of the cable terminal. The bottom 4a of the cup-shaped electrode 4 is further detachably fastened to a feedthrough plate 7, through which the extension 6 passes.

The metal encapsulation 1 is fastened to the feedthrough plate 7 which is bolted to a frame or tube 8.

The bottom 4a of the cup-shaped electrode 4 is in the form of a hat having a rim 4b to which a flange 6a of the extension 6 is bolted. The head portion 4c of the hat is within electrode 4.

The stationary terminal 3 of the vacuum switching tube 2 penetrates the head portion 4c and a fastening nut 9 is threaded on the stationary terminal 3 of the vacuum switching tube 2 to fasten the stationary terminal of the tube 2 to the electrode 4.

The advantages of the present invention, as well as certain changes and modifications of the disclosed embodiments thereof, will be readily apparent to those skilled in the art. It is the applicants' intention to cover by their claims all those changes and modifications which could be made to the embodiment of the invention herein chosen for the purpose of the disclosure without departing from the spirit and scope of the invention.

What is claimed is:

1. In an electric switching section with a metal encapsulation which contains insulating gas and, for each phase, at least one transformer and a vacuum switching tube which is enclosed by the transformer, the tube having a stationary terminal connected to a cable terminal, the improvement comprising a transformer which includes a cup-shaped electrode forming the inner electrode of a capacitive voltage transformer, the cup-shaped electrode having a bottom which is detachably connected to the stationary terminal of the vacuum switching tube and to an extension of the cable terminal, a feedthrough plate being arranged below the cup-shaped electrode to which the cup-shaped electrode is detachably fastened, the cable terminal having an extension which passes through the feedthrough plate.

2. The improvement according to claim 1 wherein the bottom of the cup-shaped electrode is in the form of a hat having a rim bolted to the feedthrough plate and to a flange of the extension of the cable terminal, the hat further having a head portion located in the cup-shaped electrode, the hat portion having an opening through which the stationary terminal of the vacuum switching tube passes, a fastening nut being threaded to the stationary terminal below the hat portion.

* * * * *